(12) United States Patent
Davis

(10) Patent No.: US 6,803,255 B2
(45) Date of Patent: Oct. 12, 2004

(54) DUAL GAUGE LEAD FRAME

(75) Inventor: Patrick A. Davis, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/209,532

(22) Filed: Jul. 31, 2002

(65) Prior Publication Data

US 2004/0021207 A1 Feb. 5, 2004

(51) Int. Cl.[7] .......................... H01L 21/00; H01L 21/50
(52) U.S. Cl. ...................... 438/111; 438/123; 257/666; 257/672; 361/813
(58) Field of Search ................. 438/111, 123; 361/813; 257/666, 672

(56) References Cited

U.S. PATENT DOCUMENTS

| | | | | |
|---|---|---|---|---|
| 4,404,264 A | * | 9/1983 | Tatum et al. | 428/573 |
| 5,068,206 A | * | 11/1991 | Kurita et al. | 228/180.21 |
| 5,557,842 A | * | 9/1996 | Bailey | 29/827 |
| 5,785,791 A | * | 7/1998 | Letterman et al. | 156/242 |
| 5,821,610 A | * | 10/1998 | Nishikawa | 257/670 |
| 5,859,387 A | * | 1/1999 | Gagnon | 174/52.2 |
| 5,889,658 A | * | 3/1999 | Sullivan et al. | 361/773 |
| 5,969,293 A | * | 10/1999 | Vikram | 174/52.4 |
| 6,107,676 A | * | 8/2000 | Suzuki | 257/666 |
| 6,320,147 B1 | | 11/2001 | Simpson | |

* cited by examiner

Primary Examiner—Jasmine Clark
(74) Attorney, Agent, or Firm—Stefan V. Chmielewski

(57) ABSTRACT

A dual gauge lead frame 36 is provided, including at least one mating surface 14 and a plurality of terminal arms 16 formed into a flat circuit surface 12 having a first gauge 32. Each of the plurality of terminal arms 16 includes a fold over terminal arm portion 28 folded over and coined into a base terminal arm portion 26 to form a plurality of end posts 30. The plurality of end posts 30 form a second gauge 34.

8 Claims, 3 Drawing Sheets

DUAL GAUGE LEAD FRAME

TECHNICAL FIELD

The present invention relates generally to a dual gauge lead frame for use in an electronics assembly. More specifically, the present invention relates a dual gauge lead frame with improved manufacturing characteristics.

BACKGROUND OF THE INVENTION

Electronic components have played an increasingly diverse role in modem product design and manufacturing. Design criteria has often lead to the miniaturization of many electronic components. Although the miniaturization of some components, such as chips, transistors, processors, etc., has proven highly successful, they must often be assembled in conjunction with circuits and assemblies of comparatively larger dimensions. This can create design and manufacturing challenges when it becomes necessary to places such miniature components in communication with these larger assemblies.

One solution to such scenarios has been through the use of lead frames. Lead frames provide an electrical conduit from the multiple small terminals commonly found on electrical components to larger connector pads wherein additional circuitry may be connected to the component. The lead frames thereby allow practical and cost effective manufacturing techniques to be utilized to "wire in" these miniature components to the rest of the electronic assembly. They do so by providing a thin multi-pathway bridge from the plurality of terminals on the miniature components to a plurality of connector pads sized and placed for convenient attachment to neighboring circuits.

As part of their function as a conduit between neighboring electronic components, lead frames are often desired to have several characteristics. Their complex and crowded pathway patterns often promote manufacturing techniques such as laser or chemical etching. Flexible pathways reduce stresses imparted into the electronic components and can loosen design tolerances necessary to mate with surrounding systems. Shapes and configurations must often balance the needs for flexibility, strength, and size. Similarly, the use of dual gauge lead frames has often allowed the bridging of contacts between multi-level and sandwich style circuit boards.

Although forming a lead frame with dual gauges can result in a beneficial configuration for assembly, often the manufacturing techniques utilized to form this dual gauge lead frame are undesirable from a cost/complexity standpoint. Extrusion processes can be utilized to create a varied gauge lead frame, but cost, accuracy, time, and flexibility can all be negatively impacted by the use of extrusion. Therefore, it often does not present itself as a viable manufacturing alternative. Laminate structures can be utilized, but they too can create costly, complex, and time consuming manufacturing processes. In addition, they can negatively impact the flexibility of the lead frame and therefore may not be suitable for some assemblies.

It would therefore be highly desirable to have a dual gauge lead frame that could be manufactured without the negative characteristics of previous techniques. It would further be highly desirable to have a dual gauge lead frame that was amenable to accurate and cost effective single gauge manufacturing techniques. Finally, it would be desirable to have a dual gauge lead frame that provided flexibility of design in regards to increase gauge portions of the lead frame.

SUMMARY OF THE INVENTION

It is, therefore, an object of the present invention to provide an improved lead frame design and process for forming. It is a further object of the present invention to provide a dual gauge lead frame design and process for forming.

In accordance with the objects of the present invention, dual gauge lead frame is provided. The dual gauge lead frame includes a flat circuit surface comprising a plurality of terminal arms. Each of the plurality of terminal arms includes an end post section. The end post section is comprised of a base terminal arm portion and a fold-over terminal arm portion coined into the base terminal arm portion. In this fashion, a dual gauge lead frame with a first gauge flat circuit surface and a plurality of second gauge end posts is provided.

Other objects and features of the present invention will become apparent when viewed in light of the detailed description of the preferred embodiment when taken in conjunction with the attached drawings and appended claims.

DESCRIPTION OF THE PREFERRED EMBODIMENT

Figure 1:
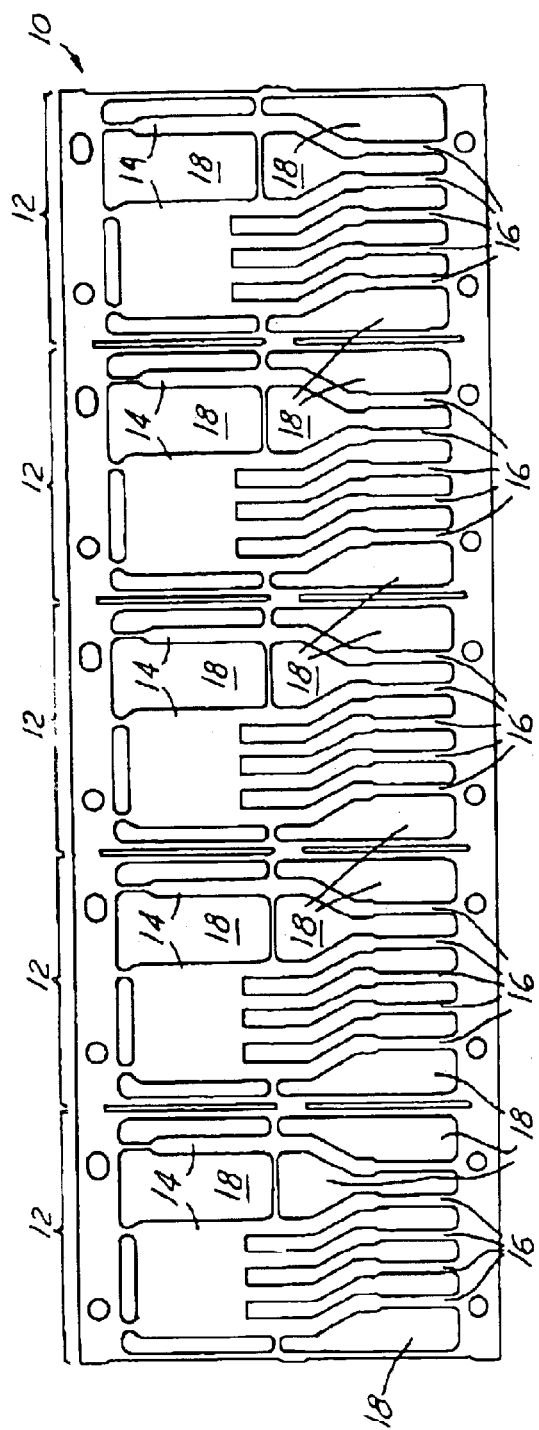
FIG. 1 is an illustration of an embodiment of a plurality of dual gauge lead frames in accordance with the present invention.

Referring now to FIG. 1, which is an illustration of a plurality of lead frames 10 in accordance with the present invention. Although the plurality of lead frames 10 is illustrated in a grouping of five individual lead frames 12, it should be understood that the plurality of lead frames 10 may be comprised of any number of individual lead frames 12 or even a single lead frame 12. Grouping of lead frames 12 into a plurality 10 is a technique beneficial for efficient and cost effective mass production.

The lead frames 12 include a flat circuit surface 12. A wide variety of flat circuit surfaces 12 are known in the field and contemplated by the present invention. The flat circuit surfaces 12 include a plurality of mating surfaces 14 and a plurality of terminal arms 16. The plurality of mating surfaces 14 and the plurality of terminal arms 16 can be formed into the flat circuit surface 12 in a variety of fashions. One embodiment contemplates stamping the flat circuit surfaces 12 to create pattern gaps 18. Other embodiments contemplate, but are not limited to, the use of chemical or laser etching to create the pattern gaps 18.

Figure 2:
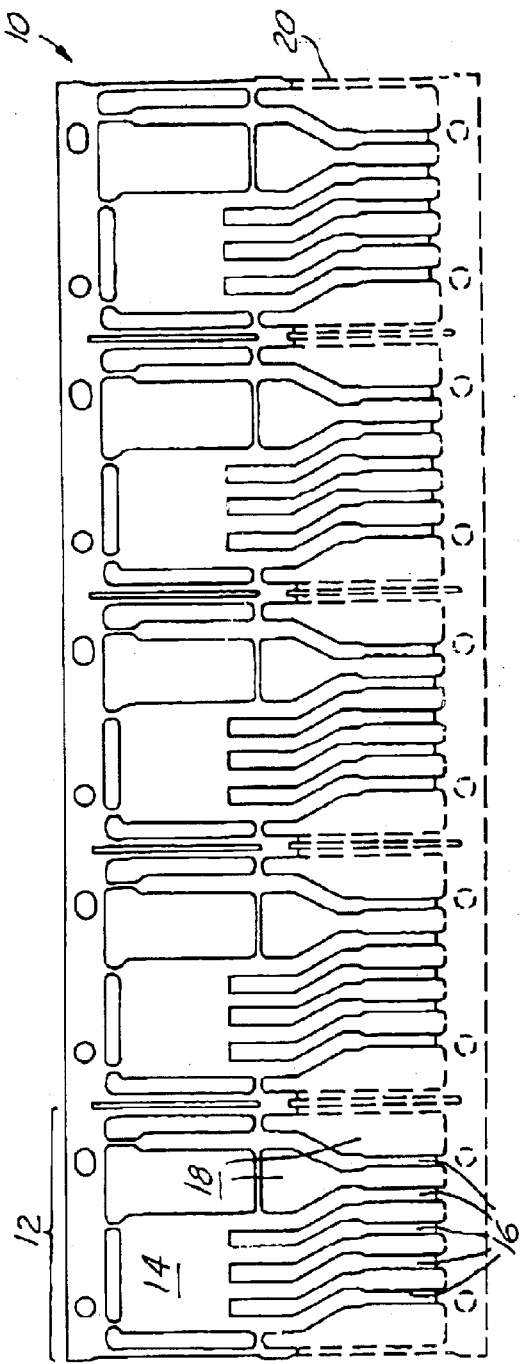
FIG. 2 is an illustration of the plurality of dual gauge lead frames illustrated in FIG. 1, the illustration depicting the trim portions.
Figure 3:
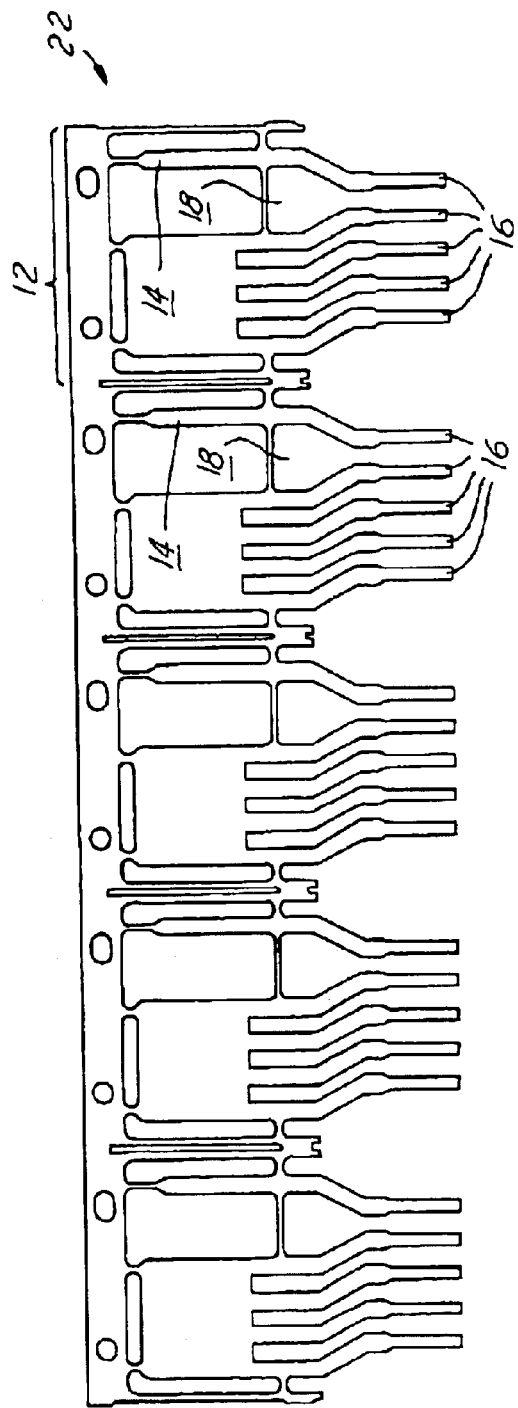
FIG. 3 is an illustration of the plurality of dual gauge lead frames illustrated in FIG. 1, the illustration depicting the plurality of dual gauge lead frames in a post-trim state.

The long and relatively thin nature of the plurality of terminal arms 16 makes it useful to form the plurality of lead frames 10 with a trim portion 20 (see FIG. 2). The trim portion 20 helps stabilize the plurality of lead frames 10 during stamping or etching and prevents the plurality of terminal arms 16 from being bent out of plane during manufacturing processes. The trim portion 20 is subsequently removed in a trimming process to result in a trimmed grouping 22 of lead frames 12. This trimmed grouping 22 frees up the plurality of terminal arms 16 allowing access to them such that they may be further processed into a plurality of dual gauge lead frames 24 (see FIGS. 4 and 5).

Figure 4:
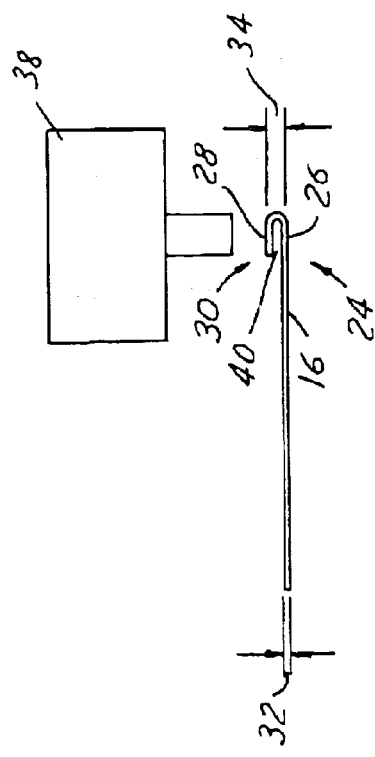
FIG. 4 is a detail illustration of the plurality of dual gauge lead frames illustrated in FIG. 3, the detail illustrating a coining operation.
Figure 5:
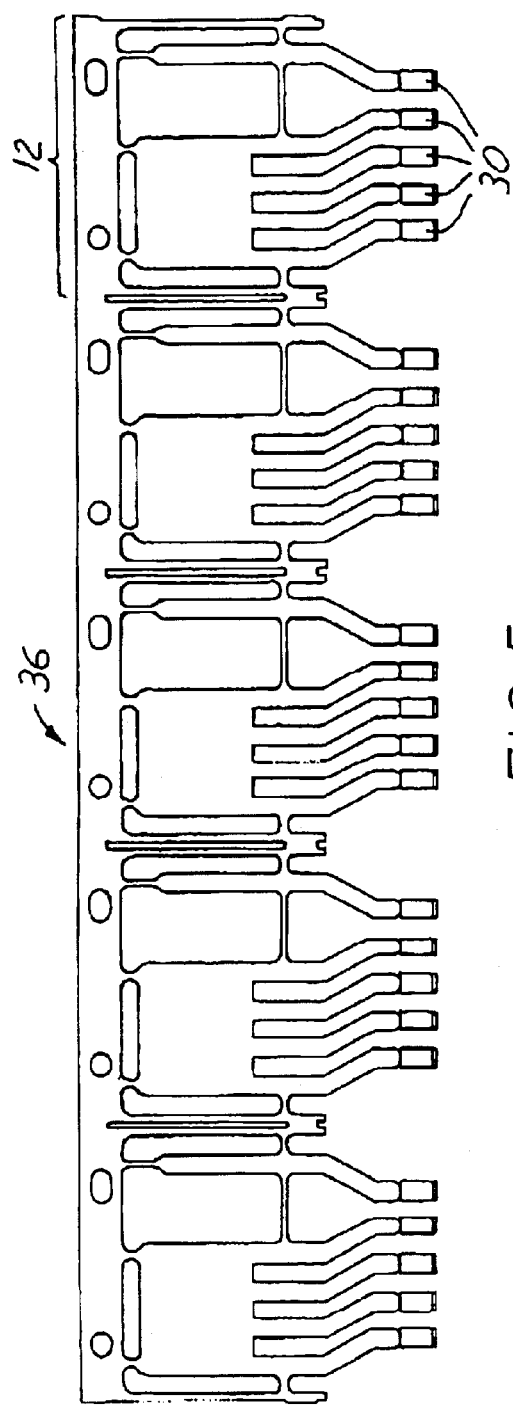
FIG. 5 is an illustration of an embodiment the plurality of dual gauge lead frames, the plurality of dual gauge lead frames illustrated in the coined state.
Figure 7:
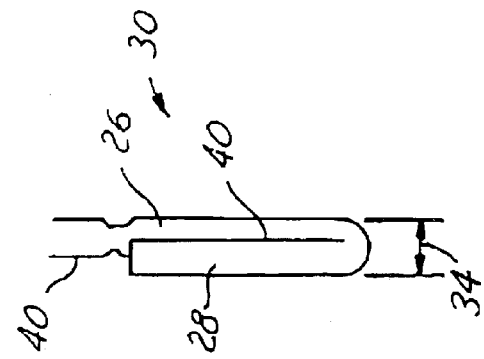
FIG. 7 is a side-view detail illustration of the end-post illustrated in FIG. 6.
Figure 6:
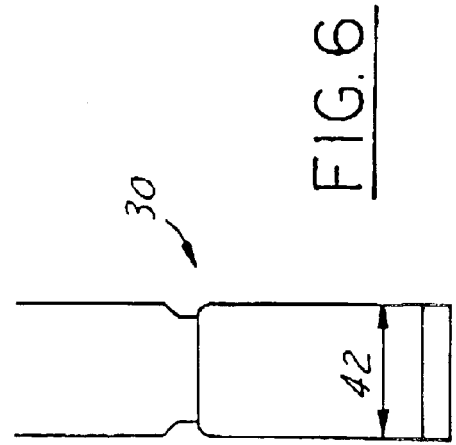
FIG. 6 is a top-view detail illustration of an end-post on a dual gauge lead frame illustrated in FIG. 5.

Each of the plurality of terminal arms 16 is comprised of a base terminal arm portion 26 and a fold over terminal arm portion 28 (see FIG. 4). The fold over terminal arm portion 28 is bent back over the base terminal arm portion 26 using any of a wide variety of manufacturing techniques to form an end post 30. The advantage of this technique is that the plurality of lead frames 10 can be formed cost effectively with a first gauge 32 over its entire surface. A second gauge 34 can be created at the end post section 30 of the plurality of terminal arms 16 as a result of the fold over terminal arm portion 28. This can be accomplished with relatively low manufacturing costs compared to extrusion and rolling techniques. In addition, the present invention may provide increased dimensional stability of the plurality of lead frames 10. In this fashion cost effective dual gauge lead frames 36 (see FIG. 5) can be provided.

Although the use of the fold over terminal arm portion 28 could be used to form the second gauge 34 alone, the flexible nature of most lead frames 12 would make such a second gauge 34 unreliable and difficult to maintain. The present invention addresses this problem by further including the process of coining the end post sections 30. Coining machines 38 are utilized to physically press the fold over terminal arm portion 28 into the base terminal arm portion 26 as illustrated in FIGS. 4 through 7. The fold over terminal arm portion 28 is pressed into the upper surface 40 of the base terminal arm portion 26 and thereby secures the portions together. This creates a dimensional stability that may not be present using a folding process alone. In addition, it can be utilized to control the exact dimensions of the second gauge 34 as well as the end post width 42 by varying the degree of coining. Finally, the shape of the end post 30 can additionally be modified or controlled using the coining process. This allows further flexibility to design of the dual gauge lead frames 36 without the necessity of expensive manufacturing processes.

While particular embodiments of the invention have been shown and described, numerous variations and alternative embodiments will occur to those skilled in the art. Accordingly, it is intended that the invention be limited only in terms of the appended claims.

What is claimed is:

1. A method of manufacturing a dual gauge lead frame comprising:

forming a plurality of terminal arms and at least one mating surface into a flat circuit surface, said plurality of terminal arms and said mating surface formed from a first gauge;

folding a fold over portion of each of said plurality of terminal arms back onto a base terminal portion to form a plurality of end posts;

coining said end posts such that said fold over portions are secured to said base terminal portions, said end posts creating a second gauge.

2. A method of manufacturing a dual gauge lead frame as described in claim 1, wherein said forming a plurality of terminal arms and at least one mating surface comprises stamping a plurality of pattern gaps into said flat circuit surface.

3. A method of manufacturing a dual gauge lead frame as described in claim 1, wherein said forming a plurality of terminal arms and at least one mating surface comprises etching a plurality of pattern gaps into a flat circuit surface.

4. A method of manufacturing a dual gauge lead frame as described in claim 1, further comprising:

removing a trim portion from said flat circuit surface.

5. A method of manufacturing a dual gauge lead frame as described in claim 1, further comprising:

adjusting an end post width during said coining.

6. A method of manufacturing a dual gauge lead frame as described in claim 1, further comprising:

adjusting an end post shape during said coining.

7. A method of manufacturing a dual gauge lead frame as described in claim 1, further comprising:

adjusting said second gauge during said coining.

8. A method of manufacturing a dual gauge lead frame as described in claim 1, further comprising:

forming a plurality of lead frames into said flat circuit surface.

* * * * *